(12) United States Patent
Delheimer

(10) Patent No.: US 6,750,084 B2
(45) Date of Patent: Jun. 15, 2004

(54) METHOD OF MOUNTING A LEADLESS PACKAGE AND STRUCTURE THEREFOR

(75) Inventor: Charles I. Delheimer, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/177,940

(22) Filed: Jun. 21, 2002

(65) Prior Publication Data

US 2003/0234441 A1 Dec. 25, 2003

(51) Int. Cl.⁷ .............................................. H01L 21/50
(52) U.S. Cl. ...................... 438/117; 438/106; 438/121; 438/122; 257/678; 257/738; 174/252
(58) Field of Search ................ 174/252; 257/678, 257/738, 718; 438/106, 121, 122, 117, 119, 625, 672

(56) References Cited

U.S. PATENT DOCUMENTS

| | | | |
|---|---|---|---|
| 5,708,566 A | * | 1/1998 | Hunninghaus et al. ....... 361/704 |
| 5,842,275 A | * | 12/1998 | McMillan et al. ............. 29/840 |
| 6,012,223 A | | 1/2000 | Hinze |
| 6,194,782 B1 | * | 2/2001 | Katchmar .................... 257/738 |
| 6,233,817 B1 | | 5/2001 | Ellis et al. |
| 6,251,501 B1 | | 6/2001 | Higdon et al. |
| 6,375,062 B1 | | 4/2002 | Higdon et al. |
| 6,441,312 B1 | * | 8/2002 | Tanimura et al. ........... 174/252 |
| 6,614,108 B1 | | 9/2003 | Sanftleben et al. |
| 2002/0066948 A1 | * | 6/2002 | Hyeong-Scob ............... 257/678 |

OTHER PUBLICATIONS

*Application Notes for Surface Mount Assembly of Amkor's MicroLeadFrame (MLF) Packages,* (Mar. 2001/Rev.B), p. 1–14.

* cited by examiner

*Primary Examiner*—Huan Hoang
*Assistant Examiner*—Dao H. Nguyen
(74) *Attorney, Agent, or Firm*—Jimmy L. Funke; Stefan V. Chmielewski

(57) ABSTRACT

A method and circuit structure for mounting a leadless IC package to a substrate having a thermal pad on a first surface thereof, a plurality of contact pads surrounding the thermal pad, and one or more plated vias in the thermal pad. The leadless package is attached to the substrate with solder that thermally connects the package to the thermal pad. To prevent solder flow into the plated vias during reflow, a solder mask is provided on the first surface of the substrate, at least a portion of which is deposited on the thermal pad and surrounds the plated vias but does not block the plated vias. The solder mask portion defines a barrier between the solder and the plated vias, but allows for outgassing through the vias during solder reflow.

12 Claims, 3 Drawing Sheets

METHOD OF MOUNTING A LEADLESS PACKAGE AND STRUCTURE THEREFOR

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to semiconductor integrated circuit (IC) devices. More particularly, this invention relates to a method and structure for solder-mounting a leadless IC package to a substrate equipped with thermal vias, and for preventing solder from entering the vias during solder reflow.

(2) Description of the Related Art

Various packaging configurations have been proposed for mounting IC devices to circuit boards and other electronic substrates. Conventional packages typically require wire leads that electrically connect the package to contact pads on the surface of the circuit board. Leadless packages have been developed that do not have wire leads, but instead have input/output (I/O) pads exposed at a surface of the package. Such packages are known in the industry as quad flat non-leaded (QFN) packages. An example is a QFN package commercially available from Amkor Technology under the name Microleadframe (MLF). As represented in FIG. 1, the Amkor MLF package is a plastic-encapsulated IC package 30 with a copper leadframe 46 that defines lands (I/O pads) 40 near the outer perimeter of the package 30. An IC device 42 is attached to a die paddle (thermal pad) 32 located on the same surface of the package 30 as the pads 40 and surrounded by the pads 40. Wire leads 44 electrically connect the IC device 42 to the I/O pads 40, which in turn are electrically and mechanically connected with solder joints to contact pads on a circuit board or other suitable substrate. The thermal pad 32 promotes heat transfer from the IC device 42 to the circuit board. The circuit board can be equipped with a thermal pad on its surface for contact with the thermal pad 32 of the package 30 to promote heat transfer and dissipation in the circuit board. Heat transfer is promoted by soldering the thermal pad 32 to the thermal pad of the circuit board, and further by forming plated vias (plated through-holes, or PTH's) in the thermal pad of the circuit board to promote heat transfer through the circuit board to the surface opposite the package 30, where a heat sink or other suitable means can be provided for dissipating heat.

The solder joints at the I/O pads of a leadless package must be sufficiently thick (in the direction normal to the pads) to be compliant for surviving numerous thermal cycles. Solder joint height at the pads is affected by the relatively large volume of solder present between the thermal pads of the package and circuit board. If thermal vias are present in the thermal pad of the circuit board, loss of solder through the vias during reflow can cause the package to collapse toward the circuit board, reducing solder joint height. FIGS. 2 through 4 show a solution proposed in the past to prevent solder wicking into thermal vias. FIG. 2 represents the surface of a substrate 112 prepared for mounting a leadless package, e.g., the package 30 of FIG. 1. The substrate 112 is shown as having a thermal pad 114 surrounded by input/output pads 116, and with plated thermal vias 118 in the thermal pad 114 and extending through the substrate 112. A solder mask is shown as having been applied to the surface of the substrate 112, with openings 124 and 126 patterned in the solder mask to define an outer mask portion 120 surrounding the thermal pad 114 and interior mask portions 122 covering each of the vias 118, thereby plugging or "tenting" the vias 118. As represented in FIG. 3, solder paste 134 is then applied to the thermal pad 114, and the leadless package 30 is placed on the substrate 112 so that its thermal pad 32 is registered with the solder paste 134. Solder paste is also deposited on the contact pads 116 (shown in FIG. 2) at the same time as the paste 134 is deposited on the thermal pad 114, such that the I/O pads 40 of the package 30 also register with solder paste. The solder paste 134 is then reflowed to form a solder joint 136 between the thermal pads 114 and 32, as depicted in FIG. 4, as well as solder joints that electrically connect the I/O pads 40 to the contact pads 116.

FIGS. 3 and 4 show the vias 118 as also being closed by solder masks 128 applied to the lower surface of the substrate 112. In practice, only one of the sets of solder masks 122 or 128 would typically be used to plug the vias 118. Reported experiments suggest that masking the vias 118 at the surface of the thermal pad 114 (with solder masks 122) provides better results in terms of reducing void formation during reflow.

BRIEF SUMMARY OF THE INVENTION

The present invention is directed to a method and circuit structure for mounting a leadless IC device to a substrate, such as a circuit board. The method and structure are directed to mounting a leadless device to a substrate having a thermal pad on a first surface thereof, a plurality of contact pads surrounding the thermal pad, and one or more plated vias in the thermal pad and extending through the substrate to an oppositely-disposed second surface of the substrate. The leadless device comprises a thermal pad disposed at a surface of the leadless device for alignment with the substrate thermal pad, a plurality of input/output pads surrounding the device thermal pad for alignment with the contact pads of the substrate, and an integrated circuit device electrically connected to the input/output pads. The leadless device is attached to the substrate with solder that thermally connects the device thermal pad to the substrate thermal pad. To prevent solder flow into the plated vias during reflow, solder mask is provided on the first surface of the substrate, at least a portion of which is deposited on the substrate thermal pad and surrounds the plated via but does not block the plated via. In this manner, the portion of the solder mask defines a barrier between the solder and the plated via, but allows for outgassing through the via during the reflow process.

In view of the above, the present invention provides a solution to the problem of solder wicking through thermal vias during reflow, without resorting to blocking the vias as was believed necessary in the past. As a result, solder joints having adequate thicknesses can be readily achieved, promoting the reliability of the leadless device. An added benefit is the reduction in voids within the solder joint between the thermal pads of the leadless device and substrate as a result of the vias enabling flux outgassing during solder reflow. The solder mask remains as a permanent structure between the leadless device and the substrate, and can be selectively applied to closely surround the perimeters of the individual vias so that the remaining surface of the substrate thermal pad is exposed for attachment with solder to the leadless device. The solder mask can also be patterned to define a grid through which limited surface regions of the substrate thermal pad are exposed, creating multiple solder joints defined between the thermal pads of the leadless device and substrate.

Other objects and advantages of this invention will be better appreciated from the following detailed description.

DETAILED DESCRIPTION OF THE INVENTION

Figure 1:
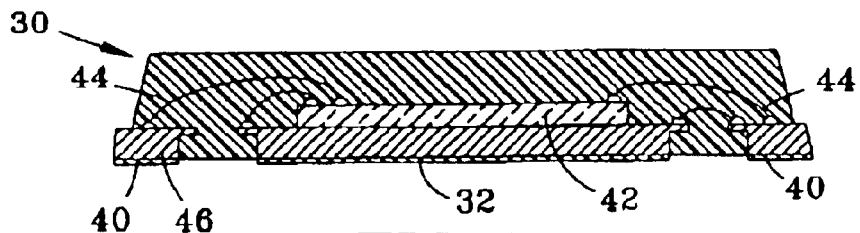
FIG. 1 is a cross-sectional view of a leadless IC package.
Figure 2:
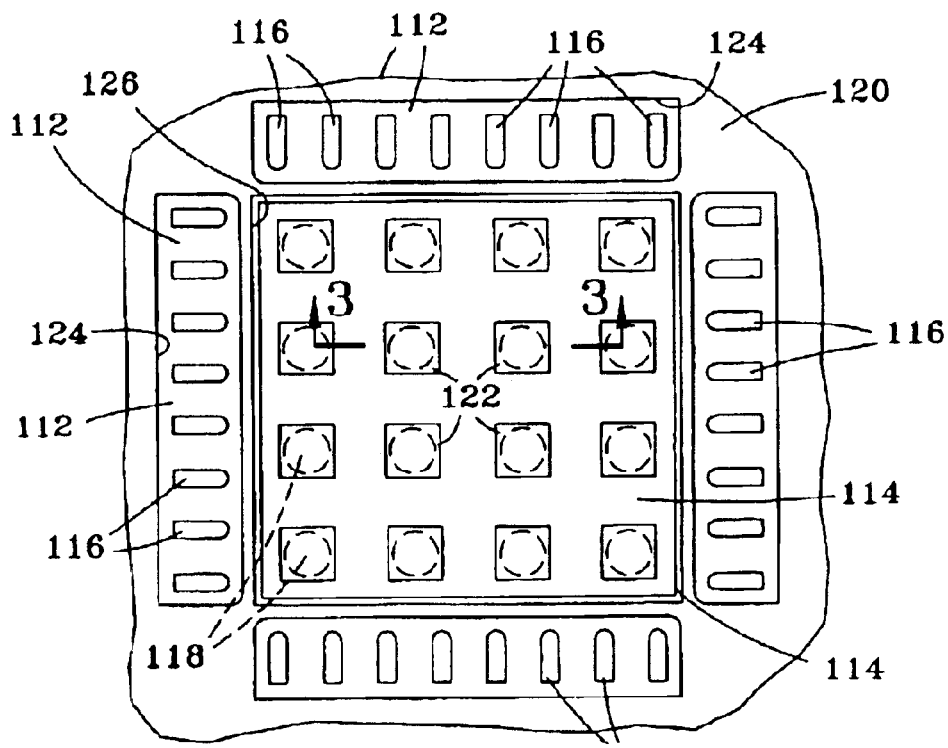
FIG. 2 is a plan view of a substrate equipped with a thermal pad and plated vias for mounting a leadless package in accordance with the prior art.
Figure 3:
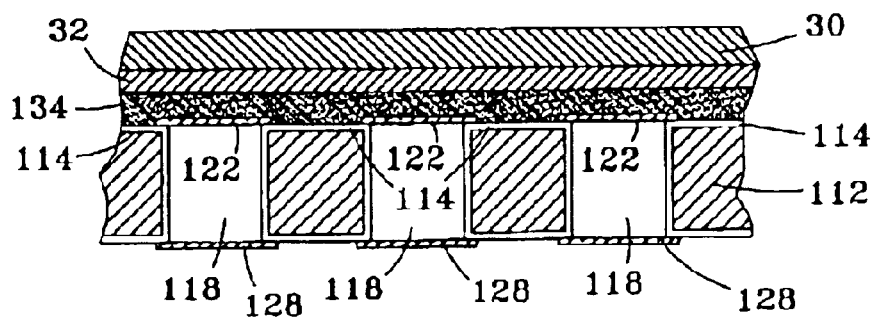
FIGS. 3 and 4 illustrate processing steps for mounting a leadless package to the substrate of FIG. 1.
Figure 4:
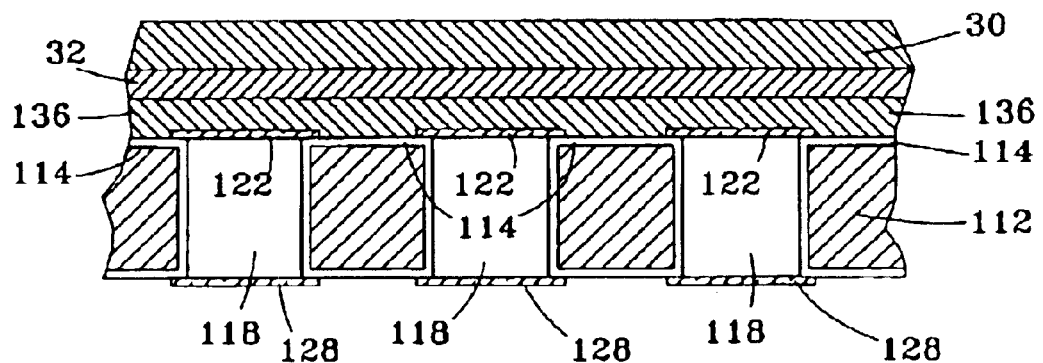
Figure 5:
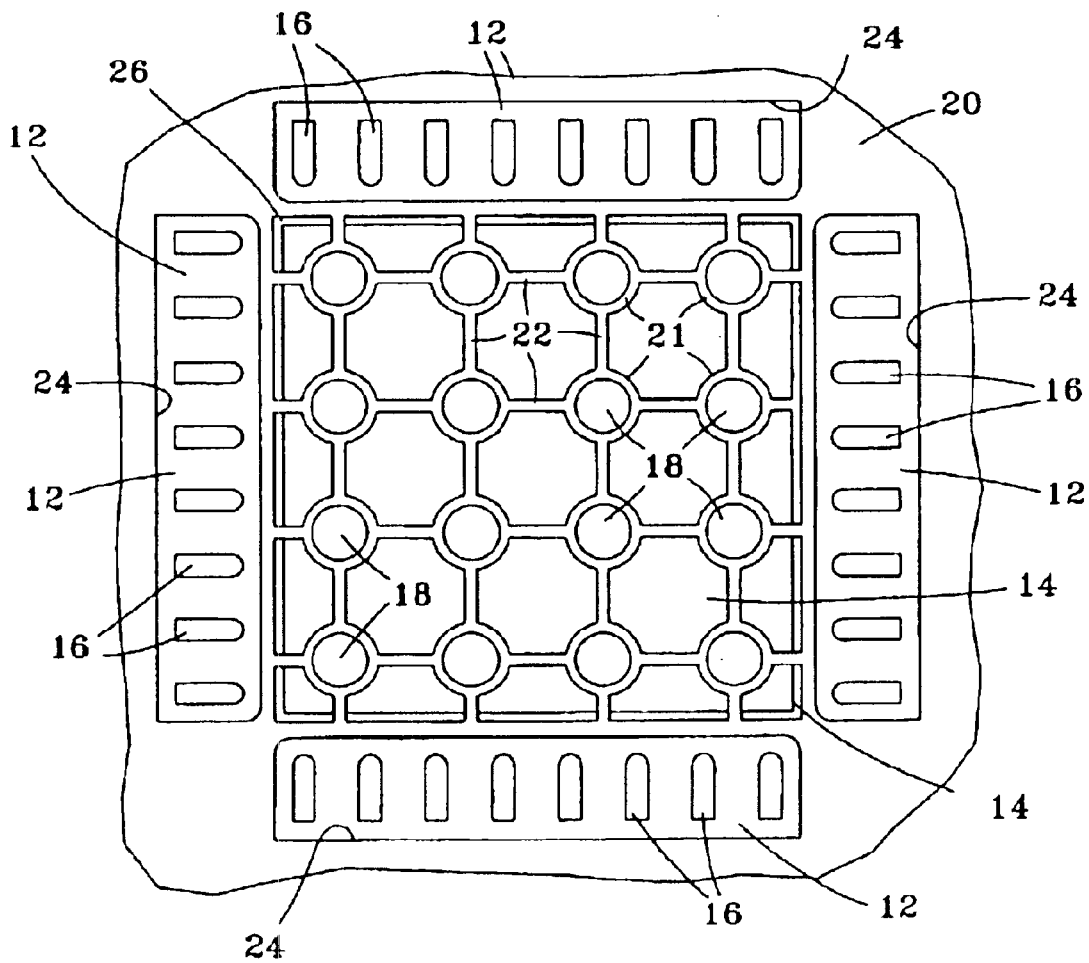
FIG. 5 is a plan view of a substrate equipped with a thermal pad, plated vias and solder mask for mounting a leadless package in accordance with a preferred embodiment of the present invention.

FIG. 5 represents a circuit structure 10 in accordance with a preferred embodiment of this invention. FIG. 5 shows a surface of a substrate 12 prepared for mounting a leadless package, represented as the MLF package 30 of FIG. 1, and is therefore similar in appearance to the substrate surface depicted in FIG. 2. However, the substrate 12 could be configured for mounting other types of leadless (QFN) packages. The substrate 12 may be a printed circuit board (PCB), flexible circuit, or a silicon, ceramic or insulated metal substrate, as is known in the art. In practice, an organic-based laminate PCB having a thickness of about 0.062 inch (about 1.57 mm) has been found to be suitable. A thermal pad 14 and surrounding I/O pads 16 are shown as having been formed on the surface of the substrate 12. The thermal pad 14 and I/O pads 16 are preferably formed of copper, such as by etching copper that has been cladded, laminated, plated or otherwise deposited on the surface of the substrate 12, though the use of other conductive materials and deposition techniques are within the scope of this invention. Plated thermal vias 18 are shown as being defined in the substrate thermal pad 14 and extending through the substrate 12. While a 4×4 matrix of vias 18 is shown, any number of vias 18 could be used, depending on the size of the thermal pad 14 and package 30. Suitable methods for forming the vias 18 and depositing a thermally conductive material (e.g., copper) are well known in the art, and therefore will not be discussed here. The after-plated diameters of the vias 18 are preferably on the order of about 0.425 to about 0.575, nominally about 0.50 mm.

FIG. 5 also shows a solder mask 20 that has been applied and patterned on the surface of the substrate 12. The mask 20 is preferably formed of a photoimageable material having acceptable feature definition and thickness properties for the process to be described below. A suitable photoimageable material for this purpose is a solder mask available from Vantico under the name Probimer 77MA, though other suitable solder mask materials could be used. In FIG. 5, the mask 20 has been imaged and openings 24 and 26 have been developed in accordance with known practices for the particular mask material. The openings 24 are shown as exposing each set of pads 16, while the openings 26 expose multiple surface regions of the thermal pad 14. As evident from FIG. 5, the openings 26 are patterned such that the solder mask 20 defines a grid over the thermal pad 14, with annular-shaped portions 21 of the mask 20 surrounding each of the vias 18 and with rectilinear portions 22 therebetween that interconnect the annular-shaped portions 21. From FIGS. 5 and 6, it can be seen that the annular-shaped portions 21 closely surround the vias 18, preferably contacting the edge of each via 18 at the substrate surface and slightly intruding into the vias 18. However, the annular-shaped portions 21 do not block the vias 18.

Figure 6:
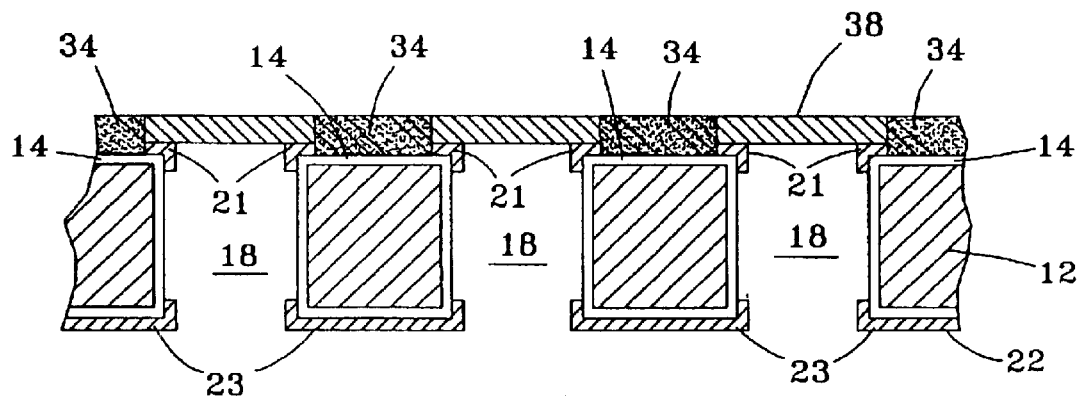
FIGS. 6 through 8 illustrate processing steps for mounting a leadless package to the substrate of FIG. 5.
Figure 7:
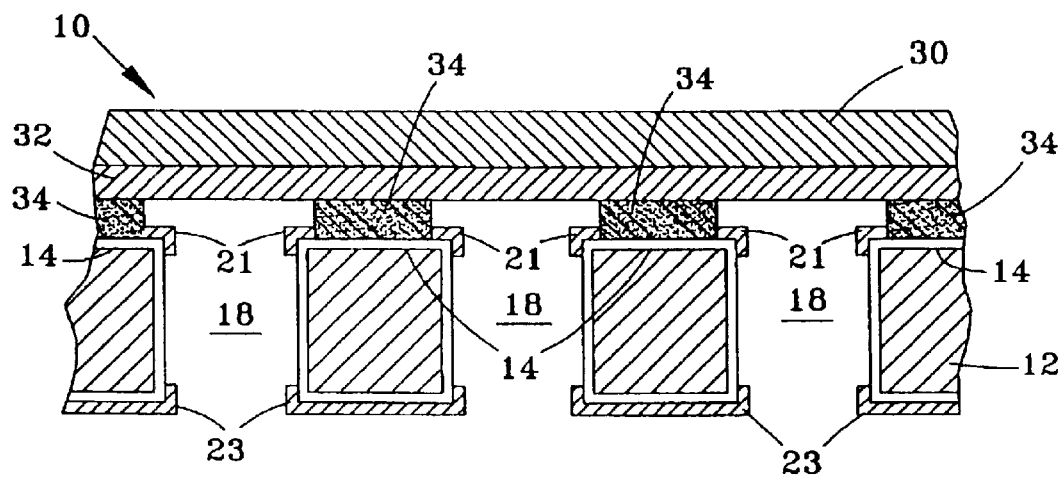

The exposed pads 16 and the multiple surface regions of the thermal pad 14 delineated by the rectilinear portions 22 of the mask 20 provide locations for receiving solder that will bond the leadless package 30 to the substrate 12, as shown in FIGS. 6 and 7. FIG. 6 depicts the deposition of a solder paste 34 through a stencil 38 positioned and aligned on the surface of the substrate 12 so that the paste 34 is selectively deposited on the pads 16 (not shown) and the exposed surface regions of the substrate thermal pad 14. The paste 34 is a mixture of a flux compound and particles of a suitable solder alloy, such as 60Sn-40Pb or 63Sn-37Pb. From FIG. 6, it is evident that the solder paste 34 on the thermal pad 14 between adjacent vias 18 has been deposited to a thickness significantly greater than the thickness of the annular-shaped portions 21 of the solder mask 20. Consequently, the solder mask 20 is not required to establish or limit the amount of solder (36 in FIG. 8) that will bond the package 30 to the substrate 12, and the solder paste 34 deposited with the stencil 38 can and preferably does exceed the thickness of the solder mask 20. For example, using a solder mask 20 (including the portions 21 and 22) having a thickness of about 10 to about 25 micrometers, the stencil 38 can be used to deposit solder paste 34 to a thickness of about 0.005 to about 0.006 inch (about 125 to about 150 micrometers). In this manner, sufficient solder paste 34 can be deposited to form solder joints 36 of adequate thickness to be reliable when subjected to thermal excursions. A suitable thickness for the solder joints 36 is believed to be in excess of twenty-five micrometers, though greater and lesser thicknesses may be appropriate, depending on the geometries and materials of the components.

Figure 8:
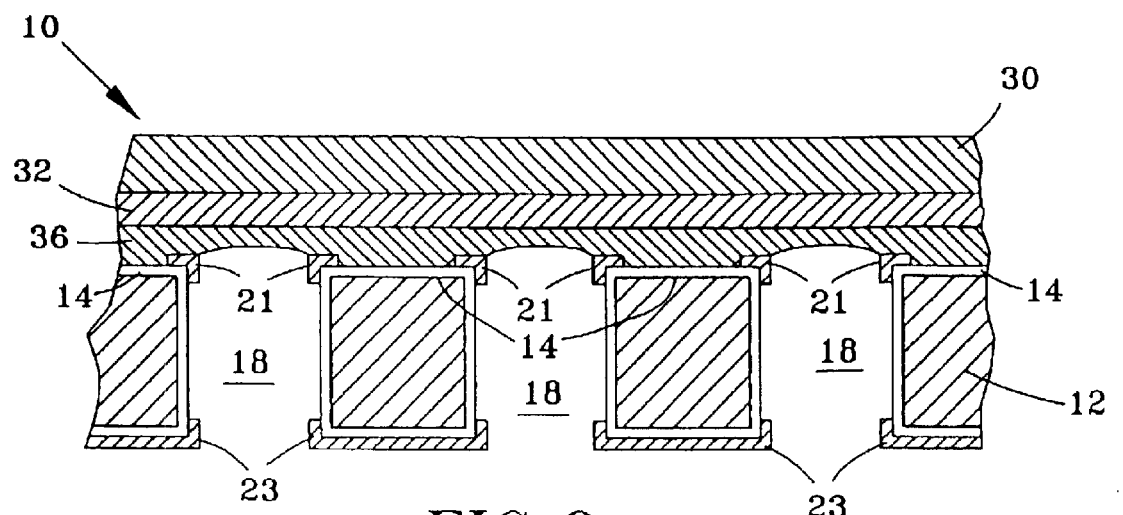

In FIG. 7, the stencil 38 has been removed and the leadless package 30 registered with the substrate 12 so that a thermal pad 32 on the surface of the package 30 contacts the solder paste 34 deposited on the substrate thermal pad 14, i.e., between the vias 18. Simultaneously, I/O pads (not shown) located near the perimeter of the package 30 and surrounding the package thermal pad 32 are registered with the contact pads 16 on the substrate 12. Thereafter, the resulting assembly 10 is heated sufficiently to vaporize or burn off the flux and melt the solder alloy particles of the solder paste 34, yielding the solder joints 36 depicted in FIG. 8 as physically and thermally connecting the thermal pad 32 of the package 30 to the thermal pad 14 of the substrate 12. As evident from FIG. 8, the annular-shaped portions 21 of the solder mask 20 provide barriers surrounding the vias 18 that prevent the molten solder from wicking into and potentially blocking the vias 18. Furthermore. FIG. 8 shows that the portions 21 of the solder mask 20 surrounding the vias 18 have permitted the molten solder to wick onto the surface of the thermal pad 32 during reflow, so that the resulting solder joints 36 connecting the package thermal pad 32 to the individual exposed regions of the substrate thermal pad 14 are connected with solder that bridges over the vias 18 without entering them. It is believed that the annular-shaped portions 21 are effective as barriers at thicknesses of as little as about 10 micrometers and widths (the difference between the radii of the portion 21 and via 18) of as little as about 150 micrometers.

Because the portions 21 prevent the molten solder 36 from entering the vias 18, the solder 36 remains between the package 30 and substrate 12 and prevents the package 30 from being drawn excessively close to the substrate 12 during reflow, which could reduce the height of the solder joints 36 to the point where reliability of the solder joint 36 is reduced. In addition, during the reflow process, gases that evolve from the flux are able to escape through the vias 18, thereby reducing the likelihood of voids being created in the solder joints 36. The absence or reduction in voids further promotes the reliability of the solder joints 36 and heat transfer from the package 30 to the substrate 12.

When placed in service, heat generated by the package 30 is readily conducted to the lower surface of the substrate 12 through the thermal pads 14 and 32 and the metal walls of the vias 18, thereby dissipating heat away from the package 30. The substrate 12 can be subsequently mounted to a heat sink (not shown) to promote thermal dissipation. FIGS. 6 through 8 depict annular-shaped solder mask portions 23 applied around the openings to the vias 18 at the surface of the substrate 12 opposite the thermal pad 14. These mask portions 23 are useful if solder is to be applied to the lower surface of the substrate 12, such as a wave soldering process to attach stick-lead components to the upper surface of the substrate 12.

While the invention has been described in terms of a preferred embodiment, it is apparent that other forms could be adopted by one skilled in the art. For example, the substrate 12, vias 18 and package 30 could be configured differently from those shown in the Figures and yet achieve the objects of this invention, and different materials could be used than those noted. Accordingly, the scope of the invention is to be limited only by the following claims.

What is claimed is:

1. A method of attaching a leadless package to a substrate having a substrate thermal pad on a first surface thereof, a plurality of contact pads on the first surface and surrounding the substrate thermal pad, and at least one plated via in the substrate thermal pad and extending through the substrate to an oppositely-disposed second surface of the substrate, the method comprising the steps of:

depositing a solder mask on the first surface of the substrate so that at least a first portion of the solder mask is on the substrate thermal pad and surrounds the plated via but does not block the plated via;

depositing solder on the contact pads and on regions of the substrate thermal pad exposed by the first portion of the solder mask, the solder being deposited on the exposed regions of the substrate thermal pad to a thickness greater than the thickness of adjacent portions of the solder mask;

placing a leadless package on the first surface of the substrate, the leadless package comprising a package thermal pad disposed at a surface of the leadless package, a plurality of input/output pads surrounding the package thermal pad, and an integrated circuit device electrically connected to the input/output pads, the leadless package being placed on the substrate so that the input/output pads contact the solder on the contact pads of the substrate and so that the package thermal pad contacts the solder deposited on the exposed regions of the substrate thermal pad; and reflowing the solder to form at least one solder joint that thermally connects the package thermal pad to the substrate thermal pad and multiple solder joints that electrically connect the input/output pads of the leadless package to the contact pads of the substrate, the first portion of the solder mask preventing the solder from flowing into the plated via during the reflow step and thereby promoting the thickness of the multiple solder joints.

2. The method according to claim 1, further comprising the step of depositing a second solder mask on the second surface of the substrate, at least a portion of the second solder mask surrounding the plated via but not blocking the plated via.

3. The method according to claim 1, wherein gases evolve during the reflow step and escape from between the leadless package and the substrate through the plated via.

4. The method according to claim 1, wherein the multiple solder joints on the contact pads have thicknesses of greater than 25 micrometers in a direction normal to the input/output pads and the contact pads following the reflow step.

5. The method according to claim 1, wherein the solder mask is deposited so that the first portion of the solder mask has an annular shape.

6. The method according to claim 1, wherein the solder mask is deposited so that the first portion of the solder mask contacts an edge of a corresponding one of the plated vias at the first surface of the substrate.

7. The method according to claim 1, wherein a plurality of the plated vias are present in the substrate thermal pad and extend through the substrate to the second surface of the substrate, and the solder mask is deposited so that each of the plated vias is surrounded by the first portion of the solder mask and the first portion of the solder mask contacts an edge of each of the plated vias at the first surface of the substrate.

8. The method according to claim 7, wherein the solder mask comprises a second portion on the substrate thermal pad, the second portion being configured as a grid interconnected with the first portion of the solder mask and defining regions between the plated vias in which the solder is deposited.

9. The method according to claim 1, wherein the step of depositing the solder on the contact pads and on the exposed regions of the substrate thermal pad is performed by depositing the solder through a device with openings therein aligned with the exposed regions of the substrate thermal pad so as to selectively deposit the solder thereon.

10. The method according to claim 9, wherein the at least one solder joint thermally connecting the package thermal pad to the exposed regions of the substrate thermal pad comprises solder joints that are interconnected with solder portions that wick onto the package thermal pad and bridge over the plated via during the reflow step.

11. The method according to claim 1, wherein the at least one solder joint thermally connecting the package thermal pad to the exposed regions of the substrate thermal pad comprises solder joints that are interconnected with solder portions that wick onto the package thermal pad and bridge over the plated via during the reflow step.

12. A method of attaching a leadless package to a substrate having a substrate thermal pad on a first surface thereof, a plurality of contact pads on the first surface and surrounding the substrate thermal pad, and plated vias in the substrate thermal pad and extending through the substrate to an oppositely-disposed second surface of the substrate, the method comprising the steps of:

depositing a solder mask on the first surface of the substrate so that at least a first portion of the solder mask is on the substrate thermal pad and surrounds the plated vias but does not block the plated vias;

depositing solder on the contact pads and on regions of the substrate thermal pad exposed by the first portion of the solder mask;

placing a leadless package on the first surface of the substrate, the leadless package comprising a package thermal pad disposed at a surface of the leadless package, a plurality of input/output pads surrounding the package thermal pad, and an integrated circuit device electrically connected to the input/output pads, the leadless package being placed on the substrate so that the input/output pads contact the solder on the contact pads of the substrate and so that the package thermal pad contacts the solder deposited on the exposed regions of the substrate thermal pad; and reflowing the solder to form solder joints that thermally connect the package thermal pad to the exposed regions of the substrate thermal pad and multiple solder joints that electrically connect the input/output pads of the leadless package to the contact pads of the substrate, the first portion of the solder mask preventing the solder from flowing into the plated vias during the reflow step and thereby promoting the thickness of the multiple solder joints, the solder joints thermally connecting the package thermal pad to the exposed regions of the substrate thermal pad being interconnected with solder portions that wick onto the package thermal pad and bridge over the plated vias during the reflow step.

* * * * *